United States Patent
Effenberger

(10) Patent No.: US 10,608,781 B2
(45) Date of Patent: Mar. 31, 2020

(54) APPLYING FORWARD ERROR CORRECTION IN 66B SYSTEMS

(71) Applicant: Futurewei Technologies, Inc., Plano, TX (US)

(72) Inventor: Frank J. Effenberger, Colts Neck, NJ (US)

(73) Assignee: Futurewei Technologies, Inc., Plano, TX (US)

(*) Notice: Subject to any disclaimer, the term of this patent is extended or adjusted under 35 U.S.C. 154(b) by 311 days.

(21) Appl. No.: 14/988,517

(22) Filed: Jan. 5, 2016

(65) Prior Publication Data

US 2016/0127081 A1    May 5, 2016

Related U.S. Application Data

(63) Continuation of application No. 13/929,867, filed on Jun. 28, 2013, now Pat. No. 9,264,071, which is a continuation of application No. 13/433,012, filed on Mar. 28, 2012, now Pat. No. 8,533,561, which is a continuation of application No. 11/874,978, filed on Oct. 19, 2007, now Pat. No. 8,171,370.

(60) Provisional application No. 60/865,770, filed on Nov. 14, 2006.

(51) Int. Cl.
*H03M 13/05*    (2006.01)
*H04L 1/00*    (2006.01)
*H04L 29/06*    (2006.01)

(52) U.S. Cl.
CPC .......... *H04L 1/0045* (2013.01); *H03M 13/05* (2013.01); *H04L 1/0057* (2013.01); *H04L 1/0079* (2013.01); *H04L 69/22* (2013.01)

(58) Field of Classification Search
CPC .... H03M 13/09; H03M 13/091; H03M 13/05; H04L 1/0061; H04L 1/0057; H04L 1/0045; H04L 69/22; H04L 1/0079
USPC ........................................................ 714/758
See application file for complete search history.

(56) References Cited

U.S. PATENT DOCUMENTS

| | | |
|---|---|---|
| 5,594,734 A | 1/1997 | Worsley et al. |
| 6,385,713 B2 | 5/2002 | Yung |
| 6,606,727 B1 | 8/2003 | Yang et al. |
| 6,650,638 B1 | 11/2003 | Walker et al. |

(Continued)

FOREIGN PATENT DOCUMENTS

| | | |
|---|---|---|
| CN | 1630207 A | 6/2005 |
| CN | 101064943 A | 10/2007 |

(Continued)

OTHER PUBLICATIONS

Effenberger, F., et al., "10Gb/s EPON FEC," IEEE 802.3ac Task Force, Sep. 2006, 23 pages.

(Continued)

*Primary Examiner* — Albert Decady
*Assistant Examiner* — Enam Ahmed
(74) *Attorney, Agent, or Firm* — Conley Rose, P.C.

(57) ABSTRACT

A method and apparatus for applying Forward Error Correction (FEC) in 66 b systems. For a user data, the apparatus uses a method comprising the steps of generating one or more data blocks using a 66 b code format and the user data; generating one or more FEC parity blocks using the 66 b code format, wherein the parity is calculated over the data blocks; and generating an FEC codeword using the data blocks and the FEC parity blocks.

22 Claims, 3 Drawing Sheets

(56) References Cited

U.S. PATENT DOCUMENTS

| | | | |
|---|---|---|---|
| 7,580,637 B2 | 8/2009 | El-Ahmadi et al. | |
| 7,685,496 B2 | 3/2010 | Toyoda | |
| 7,809,021 B2 | 10/2010 | McClellan | |
| 8,136,013 B2 | 3/2012 | Valliappan et al. | |
| 8,630,223 B2* | 1/2014 | Yang | H04B 7/18582 370/316 |
| 2004/0088633 A1 | 5/2004 | Lida et al. | |
| 2004/0193997 A1* | 9/2004 | Gallezot | H04L 1/0045 714/758 |
| 2005/0028066 A1 | 2/2005 | Raahemi | |
| 2005/0047433 A1 | 3/2005 | Rizer et al. | |
| 2005/0149820 A1 | 7/2005 | Gastaldello et al. | |
| 2007/0147434 A1 | 6/2007 | Toyoda | |
| 2007/0206589 A1 | 9/2007 | Yiling et al. | |
| 2008/0182579 A1 | 7/2008 | Wang et al. | |
| 2008/0228941 A1 | 9/2008 | Popescu et al. | |
| 2008/0267131 A1 | 10/2008 | Kangude et al. | |
| 2010/0095185 A1 | 4/2010 | Ganga et al. | |
| 2010/0098413 A1* | 4/2010 | Li | H04B 10/0795 398/38 |
| 2014/0019827 A1* | 1/2014 | Ganga | H03M 13/33 714/776 |

FOREIGN PATENT DOCUMENTS

| | | |
|---|---|---|
| CN | 101198155 A | 6/2008 |
| CN | 101247647 A | 8/2008 |
| CN | 101370267 A | 2/2009 |
| EP | 2129147 A1 | 12/2009 |
| WO | 2004073222 A1 | 8/2004 |
| WO | 2005048520 A1 | 5/2005 |
| WO | 2007149013 A1 | 12/2007 |
| WO | 2008084395 A1 | 7/2008 |

OTHER PUBLICATIONS

Lindstrom, M., "LS on LTE Latency Analysis," R1-072648, 3GPP TSG RAN WG1 Meeting #49bis, Orlando, FL, Jun. 25-29, 2007, 12 pages.

Mandin, J., "Framing and Integration for Stream-Based FEC," IEEE 802.3av, Knoxville, Task Force, www.ieee802.org/3/av/public/2006_09_mandin_1.pdf, Sep. 19, 2006, 13 pages.

"Part 3: Carrier Sense Multiple Access with Collision Detection (CSMA/CD) Access Method and Physical Layer Specifications," Information Technology—Telecommunications and Information Exchange Between Systems—Local and Metropolitan Area Networks—Specific Requirements, IEEE 802.3, 2005, 417 pages.

Raahemi, B., "Error Correction on 64/66 Bit Encoded Links," Electrical and Computer Engineering 2005 Canadian Conference, Saskatoon, Canada, May 1-3, 2005, pp. 412-416.

Toyoda, H., et al., "100-Gb/s Physical-Layer Architecture for Next-Generation Ethernet," IEICE Transactions on Communications, vol. E89-B, No. 3, Mar. 1, 2006, pp. 696-703.

Notice of Allowance dated Dec. 29, 2011, 24 pages, U.S. Appl. No. 11/874,978, filed Oct. 19, 2007.

Office Action dated Dec. 22, 2010, 9 pages, U.S. Appl. No. 11/874,978, filed Oct. 19, 2007.

Office Action dated Jun. 17, 2011, 26 pages, U.S. Appl. No. 11/874,978, filed Oct. 19, 2007.

Office Action dated Jun. 15, 2012, 19 pages, U.S. Appl. No. 13/433,012, filed Mar. 28, 2012.

Notice of Allowance dated Mar. 29, 2013, 21 pages, U.S. Appl. No. 13/433,012, filed Mar. 28, 2012.

Notice of Allowance dated Aug. 13, 2013, 6 pages, U.S. Appl. No. 13/433,012, filed Mar. 28, 2012.

Notice of Allowance dated Nov. 6, 2013, 19 pages, U.S. Appl. No. 13/929,867, filed Jun. 28, 2013.

Office Action dated Mar. 27, 2015, 16 pages, U.S. Appl. No. 13/929,867, filed Jun. 28, 2013.

Notice of Allowance dated Oct. 5, 2015, 9 pages, U.S. Appl. No. 13/929,867, filed Jun. 28, 2013.

Office Action dated Jun. 4, 2014, 13 pages, U.S. Appl. No. 13/929,867, filed Jun. 28, 2013.

Office Action dated Aug. 26, 2014, 13 pages, U.S. Appl. No. 13/929,867, filed Jun. 28, 2013.

Foreign Communication From a Counterpart Application, Chinese Application No. 200780036690.4, Office Action dated Mar. 3, 2011, 4 pages.

Foreign Communication From a Counterpart Application, Chinese Application No. 200780036690.4, Partial English Translation of Chinese Office Action dated Mar. 3, 2011, 4 pages.

Foreign Communication From a Related Counterpart Application, Chinese Application No. 20078036690.4, Chinese Office Action dated Sep. 27, 2012, 4 pages.

Foreign Communication From a Related Counterpart Application, Chinese Application No. 20078036690.4, Partial English Translation of Chinese Office Action dated Sep. 27, 2012, 5 pages.

Foreign Communication From a Related Counterpart Application, Chinese Application No. 20078036690.4, Chinese Office Action dated May 4, 2012, 4 pages.

Foreign Communication From a Related Counterpart Application, Chinese Application No. 20078036690.4, Partial English Translation of Chinese Office Action dated May 4, 2012, 5 pages.

Foreign Communication From a Related Counterpart Application, Chinese Application No. 200910148040.X, Chinese Office Action dated May 29, 2012, 8 pages.

Foreign Communication From a Related Counterpart Application 200910148040.X, English Translation of Chinese Office Action dated May 29, 2012, 8 pages.

Foreign Communication From a Related Counterpart Application, European Application 07817178.2, European Office Action dated Jan. 26, 2012, 4 pages.

Foreign Communication From a Related Counterpart Application, European Application No. 07817178.2, European Search Report dated Apr. 29, 2010, 7 pages.

Foreign Communication From a Related Counterpart Application, European Application No. 10791541.5, Supplementary European Search Report dated Jul. 5, 2012, 9 pages.

Foreign Communication From a Counterpart Application, European Application No. 07817178.2, European Office Action dated May 17, 2013, 4 pages.

Foreign Communication From a Related Counterpart Application, Japanese Application 2009-535550, Office Action dated Nov. 8, 2011, 3 pages.

Foreign Communication From a Related Counterpart Application, Japanese Application 2009-535550, English Translation of Japanese Office Action dated Nov. 8, 2011, 5 pages.

Foreign Communication From a Related Counterpart Application, Japanese Application No. 2009-535550, Japanese Office Action dated Jun. 26, 2012, 2 pages.

Foreign Communication From a Related Counterpart Application, Japanese Application No. 2009-535550, English Translation of Japanese Office Action dated Jun. 26, 2012, 2 pages.

Foreign Communication From a Related Counterpart Application, PCT Application No. PCT/CN2007/070987, International Search Report dated Jan. 31, 2008, 3 pages.

Foreign Communication From a Related Counterpart Application, PCT Application No. PCT/CN2007/070987, Written Opinion dated Jan. 31, 2008, 3 pages.

Foreign Communication From a Related Counterpart Application, PCT Application PCT/CN2010/074288, International Search Report dated Oct. 8, 2010, 5 pages.

Foreign Communication From a Related Counterpart Application, PCT Application PCT/CN2010/074288, Written Opinion dated Oct. 8, 2010, 7 pages.

\* cited by examiner

APPLYING FORWARD ERROR CORRECTION IN 66B SYSTEMS

CROSS-REFERENCE TO RELATED APPLICATIONS

This application is a continuation of U.S. patent application Ser. No. 13/929,867 filed Jun. 28, 2013 by Frank J. Effenberger and titled "Applying Forward Error Correction in 66 B Systems," which claims priority to U.S. patent application Ser. No. 13/433,012 filed Mar. 28, 2012 by Frank J. Effenberger and titled "Method and Apparatus for Applying Forward Error Correction in 66 B Systems," which claims priority to U.S. patent application Ser. No. 11/874,978 filed Oct. 19, 2007 by Frank J. Effenberger and titled "Method and Apparatus for Applying Forward Error Correction in 66 B System," which claims priority to U.S. Prov. Patent App. No. 60/865,770 filed Nov. 14, 2006 by Frank J. Effenberger and titled "System for applying forward error correction in 66 b systems," which are incorporated by reference.

TECHNICAL FIELD

The present invention relates generally to network communications, and more particularly, to a method and apparatus for applying forward error correction in 66 b systems.

BACKGROUND

An Ethernet Passive Optical Network (EPON) is an emerging access network technology that provides low-cost methods of deploying optical access lines between a carrier's Central Office (CO) and a customer site. EPONs seek to bring forth a full-service access network that delivers data, video, and voice over a single optical access system.

Optional Forward Error Correction (FEC) methods are used to improve communication reliabilities in error prone environments. In a 10 Gb/s EPON system, there is a demand for use of FEC. In an FEC process, an EPON frame may be encapsulated into an FEC frame carrying parity and other FEC bits. Use of an FEC results in an increased link budget, which enables higher bit rates, longer optical terminal to optical network unit distances, as well as higher split ratios for a single Passive Optical Network (PON) tree.

A general consensus of the industry is that an FEC method should have the following properties: 64 b66 b code should be unchanged; line rate should be unchanged; and systematic block FEC codes should be used.

Therefore, what is needed is a method and apparatus that provides FEC satisfying all the criterion described above in a 66 b system.

SUMMARY

The present invention discloses a method and apparatus for applying Forward Error Correction (FEC) in 66 b systems. For a user data, the present invention uses a method having the steps of generating one or more data blocks using a 66 b code format and the user data; generating one or more FEC parity blocks using the 66 b code format, wherein the parity is calculated over the data blocks; and generating an FEC codeword using the data blocks and the FEC parity blocks.

The following description and drawings set forth in detail a number of illustrative embodiments of the invention. These embodiments are indicative of but a few of the various ways in which the present invention may be utilized.

BRIEF DESCRIPTION

For a more complete understanding of this disclosure, reference is now made to the following brief description, taken in connection with the accompanying drawings and detailed description, wherein like reference numerals represent like parts.

Figure 3:
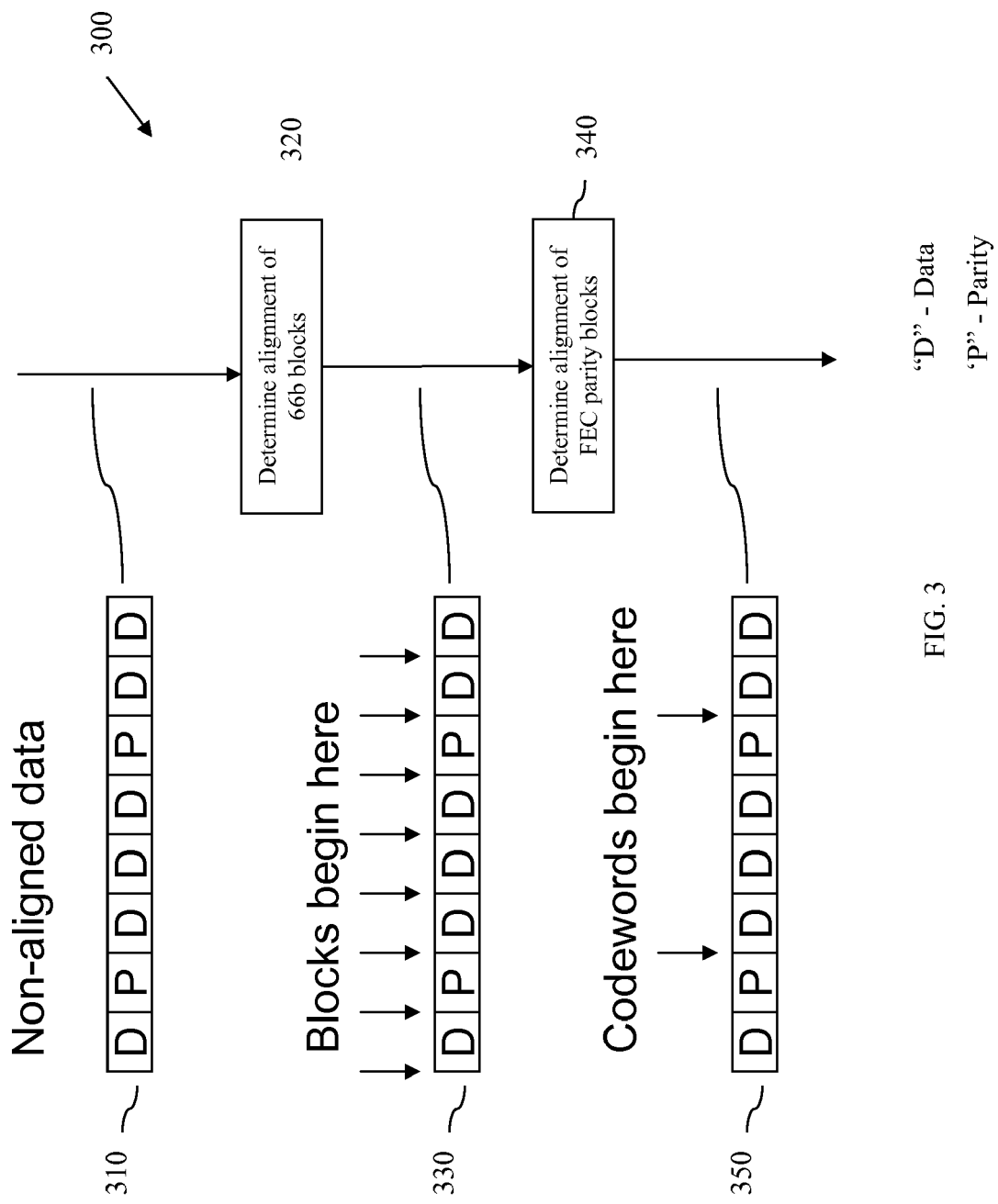

FIG. 3 a flow chart of an embodiment for delineating an FEC codeword is depicted.

DETAILED DESCRIPTION OF THE INVENTION

The following discussion is presented to enable a person skilled in the art to make and use the invention. The general principles described herein may be applied to embodiments and applications other than those detailed below without departing from the spirit and scope of the present invention as defined herein. The present invention is not intended to be limited to the embodiments shown, but is to be accorded the widest scope consistent with the principles and features disclosed herein.

The present invention provides a system for applying Forward Error Correction (FEC) in 66 b systems. The present invention satisfies all criterion specified for an FEC method, by using a 64 b66 b format code to carry both data and parity of an FEC code.

Figure 1:
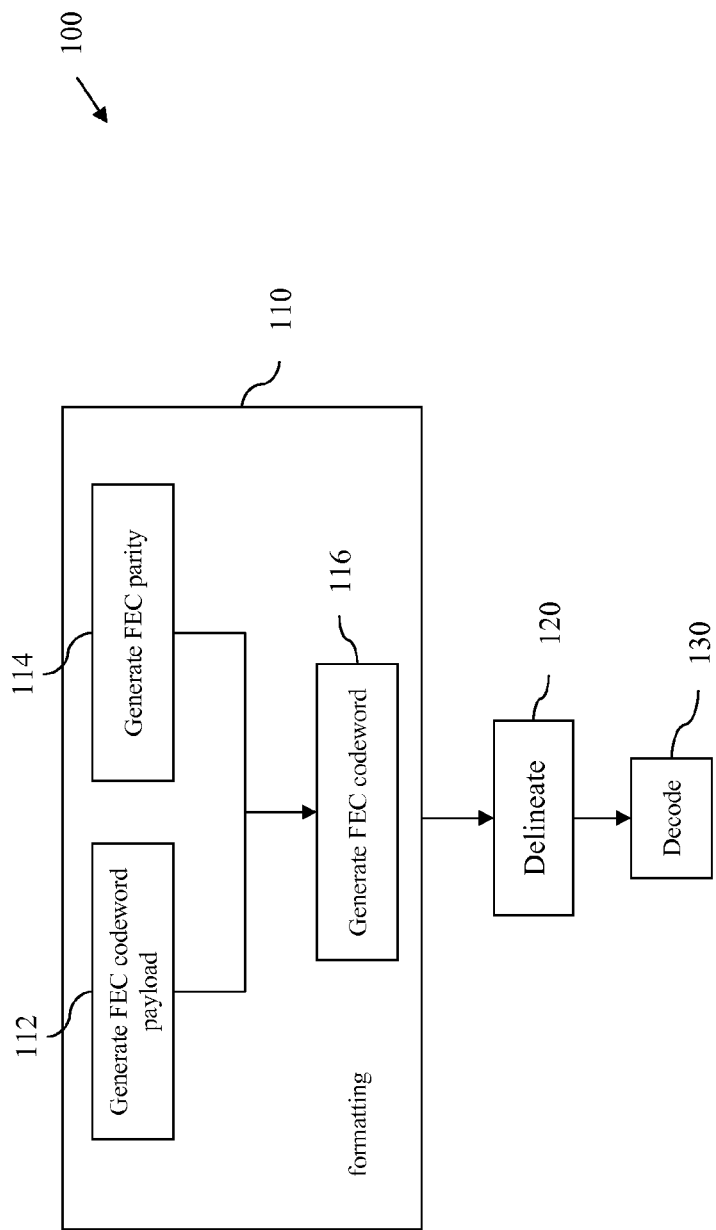
FIG. 1 is a block diagram illustrating an embodiment for applying FEC using a 64 b66 b code format in an Ethernet Passive Optical Network (EPON).

Referring to FIG. 1, a block diagram 100 for applying FEC using a 64 b66 b code format in an Ethernet Passive Optical Network (EPON) is illustrated according to one embodiment of the present invention. In this embodiment, an FEC codeword may be generated for a user data in a formatting process 110 on transmitting side, utilizing a 66 b code format. On a receiver side, the FEC codeword may be delineated in 120, and sent for decoding in 130.

In the formatting process of 110, an FEC codeword may be generated. In one embodiment of generating an FEC codeword, as shown in FIG. 1, some number X of 64 b units of user data may be formatted into the same number X of 66 b data block(s) in 112, to form an FEC codeword payload. In 114, an FEC algorithm may be used to calculate FEC parity over the entire codeword payload. The parity may then be packaged into a number Y of 66 b block(s).

A 66 b code may mark each block with a header that indicates either a data block or a code block. Selection of a "data" or a "code" framing header may be arbitrary, and may be performed to preserve normal sequence rules that apply to a 66 b code. In one embodiment, this header marking function may essentially be unused for the parity blocks. Alternatively, this function may be used to provide a special header marking for the parity blocks, as identification of the parity blocks being different from the data blocks, facilitating locating of the parity blocks.

Figure 2:
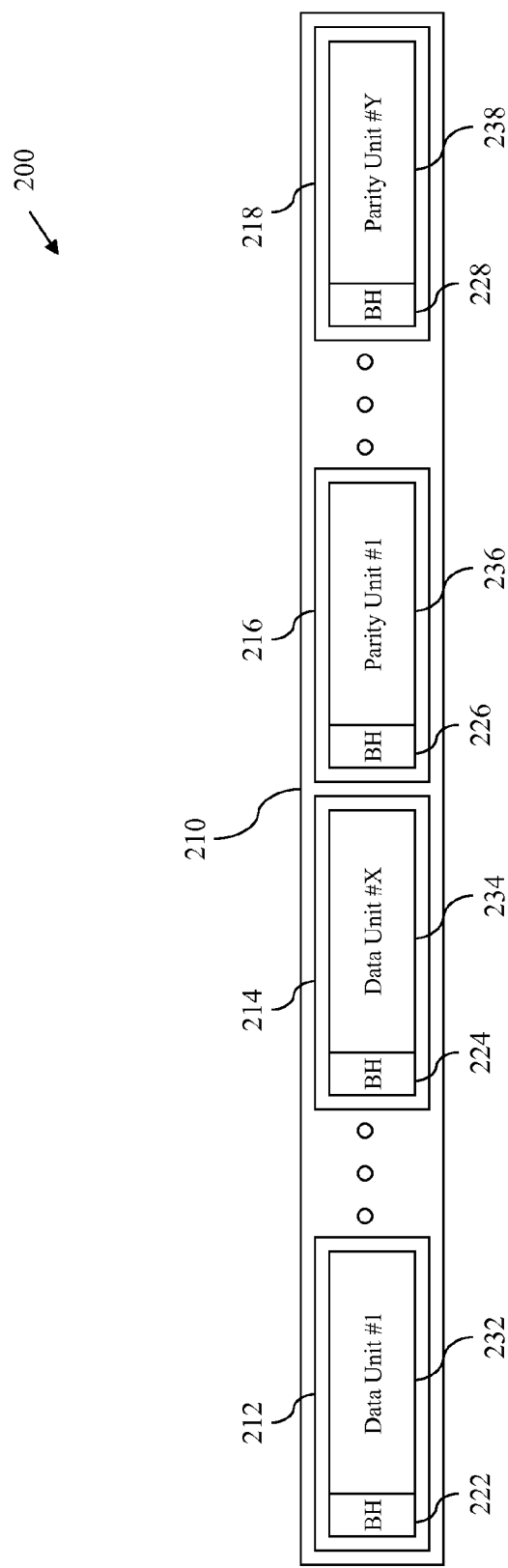
FIG. 2 is diagram illustrating an embodiment of a codeword format for applying FEC using a 64 b66 b code format in an EPON.

The resulting output of the formatting process 110 may produce a codeword of X+Y 66 b blocks in 116. Referring to FIG. 2, a codeword format 200 for applying FEC using a 64 b66 b code format in an EPON is illustrated according to one embodiment of the present invention. In this embodiment, a number of FEC parity blocks are appended after the FEC data blocks.

In FIG. 2, a codeword 210 is composed of a number of 66 b blocks. The first X blocks 212 through 214 are data blocks, composed of data or code block headers 222 through 224, and data units 232 through 234, respectively. The following Y blocks 216 through 218 are parity blocks, composed of parity block headers 226 through 228, and parity units 236 through 238, respectively.

A formatting process may be located below a 64 b66 b Physical Coding Sublayer (PCS). A standard 64 b66 b PCS emits blocks at a period of 6.4 ns. An FEC sublayer may need to insert Y blocks every (X+Y)*6.4 ns. To resolve this rate mismatch, a Media Address Control (MAC) may slow down a peak payload data rate to X/(X+Y)*10 Gb/s. This may be accomplished by stretching an inter-packet gap by an appropriate amount for each packet, so that extra idle blocks are inserted after each run of non-idle blocks. The FEC sub layer may then use a First In First Out (FIFO) to decouple the PCS rate and the FEC rate. The FIFO input receives the blocks from the 64 b66 b PCS layer. During runs of non-idle blocks, the FIFO may begin to fill. The FIFO may then drain during the subsequent extra idle blocks that were inserted. The result may be that the FIFO would always return to a nearly empty state before the next packet begins.

Delineation of an FEC codeword may be performed in various ways. In one embodiment, a 64 b66 b framing state machine may be used to find an initial block alignment of the FEC codeword; and a second method may be used to find the FEC parity blocks of the FEC codeword. Then an FEC decoding, such as the decoding process 130 in FIG. 1, may be applied to both data and 64 b66 b framing bits, thereby delivering low error rate to a 64 b66 b Ethernet framing state machine.

FIG. 3 illustrates an embodiment of a flow chart 300 for delineating an FEC codeword, wherein a receiver may employ a two-step process. An incoming stream of bits 310 (composed of many FEC codewords 350) comes to the receiver is unaligned. First, in step 320, the receiver may look for a repeating pattern of 66 b blocks in the FEC codeword. This constitutes looking for a 66 b block alignment that always produces a "01" or a "10" pattern in the first two bits of a 66 b block. Algorithms for determining this alignment with a defined level of certainty are well known in the art. For example in an algorithm, a certain number of successful codes in a row may be declared a successful alignment, while finding a certain number of non-successful codes may be declared a bad alignment, whereupon the algorithm tries a new alignment. The result of this first aligning step is to produce an aligned stream of blocks 330, which are then handed to a second step 340.

The second step 340 may delineate the codeword by looking for FEC parity blocks at the end of the FEC codeword. Since the codeword is X+Y blocks long, there are X+Y possible alignments that may be an FEC codeword. An embodiment of an algorithm to find the FEC parity blocks may be a simple hunting algorithm, where an alignment guess is made, and the resulting codeword is decoded. If the decoding process is successful, then codeword alignment is declared to be found. If not, then a new alignment is attempted. Within X+Y tries, the correct codeword alignment will be found.

In an alternative embodiment of an algorithm for determining the codeword alignment, a temporary parity may be calculated on the tentatively-aligned data payload of the FEC codeword received, and the tentatively-aligned parity is compared with the temporary parity. If a match is found, then the alignment of the FEC parity blocks is found.

Using these embodiments of delineation, a locking that is 66 times faster than a pure serial locking may be provided, because there are 66 times fewer possible alignments of an FEC codeword. This is significant, as the computation to do FEC at 10 G is non-trivial.

In another embodiment of the second step 320, if each or all the FEC parity blocks of an FEC codeword, such as the FEC codeword generated in the formatting process 110 in FIG. 1, are provided with a header that may not be normally found in a coded sequence, the header may be used to identify an FEC parity block. For example, as described previously, a 66 b code may mark each block with a bit indicating whether this block is a data or a code block. Since the parity blocks in the embodiments of the present invention are in 66 b code format, this bit may be used as a marking for identification of a parity block. Therefore, in this case, the parity blocks may be found by looking for the special 66 b blocks with the header, i.e., identifying a 66 b block using the marking provided.

Using this embodiment of delineation an even faster locking may be provided, because only 2~4 FEC blocks may be needed to locate the parity.

Just as a transmitting side needs a FIFO to decouple an FEC data rate from an MAC rate, a receiver requires a FIFO for the same purpose. However, in the case of the receiver, the FIFO is maintained at nearly full state during periods of idleness. When a non-idle sequence of blocks begins, the FIFO begins to drain, since the output rate to an MAC is faster than the input rate from an FEC decoder. Once the non-data run ends, extra idle blocks may be generated locally and inserted into the FIFO to bring the FIFO back up to full status.

The present invention may be applied to any systematic block FEC code. A FEC code of most interest commercially may be a Reed Solomon (RS) 8 bit code. In an embodiment of implementation of the embodiments of the present invention, 28 66 b data blocks may fit within a codeword. This amounts to 231 bytes of FEC data. The RS code may then produce 16 bytes of parity, which may be packaged into 2 66 b blocks. The total codeword may then be 30 66 b blocks.

One of the advantages of this embodiment is that the resulting codeword is 192 ns long. This happens to be exactly 12 time quanta as defined in the IEEE 802.3 EPON standard. This allows a time granting algorithm to be simpler in many cases, especially when a mixed 1 G and 10 G EPON are used.

In the embodiments of the present invention, payload of an FEC algorithm is an integral number of 66 b blocks; parity from an FEC algorithm is encapsulated into an integral number of 66 b blocks; and resulting FEC codeword is a 66 b coded signal. The 66 b format may be used to partially delineate a coded signal; and parity and/or a special 66 b format may be used to complete the delineation.

The embodiments of the present invention preserves 64 b66 b code format on the line. This makes the 10.3125 Gb/s line rate more "rational", rather than just a legacy from a previous protocol. The present invention makes maximal use of framing bits already available.

The previous description of the disclosed embodiments is provided to enable those skilled in the art to make or use the present invention. Various modifications to these embodiments will be readily apparent to those skilled in the art and generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for processing forward error correction (FEC) in a 66 bit (66 b) system, the method comprising:
    receiving, by a receiver, codewords, each comprising X 66 b data blocks and Y 66 b FEC parity blocks following the X 66 b data blocks, wherein each of the X 66 b data blocks comprises a first 2-bit header and a 64-bit data unit, wherein each of the Y 66 b FEC parity blocks comprises a second 2-bit header and a 64-bit parity unit, wherein each of the second 2-bit headers differs from the first 2-bit headers, and wherein X is an integer and Y equals four; and
    decoding, by the receiver, the codewords by detecting 2-bit headers in the codewords.

2. The method of claim 1, further comprising:
    declaring a successful locking when finding a first number of successful codes; and
    declaring an unsuccessful locking when finding a second number of non-successful codes.

3. The method of claim 2, wherein the first number and the second number are different.

4. The method of claim 2, wherein the first number and the second number are the same.

5. The method of claim 1, wherein the second 2-bit headers are neither binary 01 nor binary 10.

6. The method of claim 1, wherein the 66 b system is an Ethernet Passive Optical Network (EPON) system operating at a line rate of 10.3125 gigabits per second (Gb/s).

7. An apparatus for processing forward error correction (FEC) in a 66 bit (66 b) system, the apparatus comprising:
    a processor; and
    a non-transitory computer readable storage medium coupled to the processor and comprising programming for execution by the processor, the programming including instructions to:
        receive codewords, each comprising X 66 b data blocks and Y 66 b FEC parity blocks following the X 66 b data blocks, wherein each of the X 66 b data blocks comprises a first 2-bit header and a 64-bit data unit, wherein each of the Y 66 b FEC parity blocks comprises a second 2-bit header and a 64-bit parity unit, wherein each of the second 2-bit headers differs from the first 2-bit headers, and wherein X is an integer and Y equals four; and
        decode the codewords by detecting 2-bit headers in the codewords.

8. The apparatus of claim 7, wherein the programming further includes instructions to:
    declare a successful locking when finding a first number of successful codes; and
    declare an unsuccessful locking when finding a second number of non-successful codes.

9. The apparatus of claim 7, wherein the second 2-bit headers are neither binary 01 nor binary 10.

10. The apparatus of claim 7, wherein the 66 b system is an Ethernet Passive Optical Network (EPON) system operating at a line rate of 10.3125 gigabits per second (Gb/s).

11. A method for applying forward error correction (FEC) in a 66 bit (66 b) system, the method comprising:
    forming, by a transmitter, X 64-bit data units into an FEC payload portion;
    encoding, by the transmitter, the FEC payload portion using Reed-Solomon (RS) coding and an FEC parity portion that comprises Y 64-bit FEC parity units generated over the FEC payload portion; and
    combining, by the transmitter, the FEC payload portion and the FEC parity portion to form a codeword comprising X 66 b data blocks and Y 66 b FEC parity blocks following the X 66 b data blocks,
    wherein each of the X 66 b data blocks comprises a first 2-bit header and a 64-bit data unit,
    wherein each of the Y 66 b FEC parity blocks comprises a second 2-bit header and a 64-bit parity unit,
    wherein each of the second 2-bit headers differs from the first 2-bit headers, and
    wherein X is an integer and Y equals four.

12. The method of claim 11, wherein the second 2-bit headers are neither binary 01 nor binary 10.

13. The method of claim 11, further comprising forming a repeating pattern of a certain number of successful codes for the first 2-bit headers, the second 2-bit headers, or both.

14. The method of claim 11, wherein the 66 b system is an Ethernet Passive Optical Network (EPON) system operating at a line rate of 10.3125 gigabits per second (Gb/s).

15. An apparatus for applying forward error correction (FEC) in a 66 bit (66 b) system, comprising:
    a processor; and
    a non-transitory computer readable storage medium coupled to the processor and comprising programming for execution by the processor, the programming including instructions to:
        form X 64-bit data units into an FEC payload portion;
        Reed-Solomon (RS) code the FEC payload portion with an FEC parity portion that comprises Y 64-bit FEC parity units generated over the FEC payload portion; and
        combine the FEC payload portion and the FEC parity portion to form a codeword comprising X 66 b data blocks and Y 66 b FEC parity blocks following the X 66 b data blocks,
    wherein each of the X 66 b data blocks comprises a first 2-bit header and a 64-bit data unit,
    wherein each of the Y 66 b FEC parity blocks comprises a second 2-bit header and a 64-bit parity unit,
    wherein each of the second 2-bit headers differs from the first 2-bit headers, and
    wherein X is an integer and Y equals four.

16. The apparatus of claim 15, wherein the second 2-bit headers are neither binary 01 nor binary 10.

17. The apparatus of claim 15, wherein the programming further includes instructions to form a repeating pattern of a certain number of successful codes for the first 2-bit headers, the second 2-bit headers, or both.

18. The apparatus of claim 15, wherein the 66 b system is an Ethernet Passive Optical Network (EPON) system operating at a line rate of 10.3125 gigabits per second (Gb/s).

19. The apparatus of claim 15, further comprising a transmitter coupled to the processor and configured to transmit the codeword to a decoder for decoding.

20. The apparatus of claim 8, wherein the first number and the second number are different.

21. The apparatus of claim 8, wherein the first number and the second number are the same.

22. The method of claim 11, further comprising transmitting the codeword to a decoder for decoding.

* * * * *